United States Patent [19]

Kabayama

[11] 4,155,048
[45] May 15, 1979

[54] AUTOMATIC GAIN CONTROL CIRCUIT

[76] Inventor: Yozo Kabayama, 3826 Oaza Matsuoka, Oita-shi, Oita-ken, Japan

[21] Appl. No.: 874,153

[22] Filed: Feb. 1, 1978

[30] Foreign Application Priority Data

Feb. 1, 1977 [JP] Japan .................. 52-10054[U]

[51] Int. Cl.$^2$ .............................................. H03G 3/10
[52] U.S. Cl. .................................. 330/285; 330/279; 330/282
[58] Field of Search ............... 330/135, 139, 282, 284, 330/285

[56] References Cited
U.S. PATENT DOCUMENTS 3,368,156  2/1968  Kam ...................................... 330/284

Primary Examiner—Lawrence J. Dahl

[57] ABSTRACT

An automatic gain control circuit is provided with a constant potential circuit point, an amplifier circuit of which the input terminal is connected to the constant potential circuit via a resistor, and a feedback circuit which is connected between the output terminal of the amplifier circuit and the constant potential circuit point and the gain is controlled in accordance with the input voltage. The feedback circuit includes a first transistor whose base is connected to the output terminal of the amplifier circuit, the emitter is connected to a DC power source terminal and a second transistor which has a base connected to the collector of the first transistor and an emitter-collector path connected across the resistor.

3 Claims, 3 Drawing Figures

AUTOMATIC GAIN CONTROL CIRCUIT

BACKGROUND OF THE INVENTION

The present invention relates to an automatic gain control circuit.

FIG. 1 shows an automatic gain control circuit used in the intermediate frequency amplifier stage of an AM radio.

In the figure, a resistor R1 and diodes D1 and D2 are connected in series between a power source $V_{cc}$ and ground. A junction A between the resistor R1 and the diode D1 provides a constant voltage. The bias voltage at the junction A is applied to the base of a transistor TR1 through a resistor R2 for supplying a current to the base of the transistor TR1. An input signal source $V_g$ is coupled with the base of the transistor TR1 through a capacitor C1. The transistor TR1 is connected at the emitter to ground through a resistor R3 and at the collector to the power source $V_{cc}$ via a resistor R4. The collector TR1 is connected at the collector to an amplifier circuit 1 by way of a capacitor C2. The transistor TR1 operates as an emitter-common voltage amplifier circuit with a gain $R4/(r_e=R3)$. The $r_e$ is an emitter resistance of a transistor TR1. The output signal of the amplifier circuit 1 is applied to a detector circuit 2 of which the output signal is applied to the base of a transistor TR2 via a rectifier circuit 3 and is outputted to exterior. The transistor TR2 is connected at the emitter to ground and at the collector to the base of the transistor TR1.

In this circuit, when the input signal, i.e. the voltage to be applied to the base of the transistor TR1, rises, the output signal voltage of the detector circuit 2 rises and the voltage to be applied to the base of the transistor TR2 via the rectifier circuit 3 also rises. As a result, the transistor TR2 is conductive thereby to increase the voltage drop across the resistor R2. Consequently, the bias voltage of the transistor TR1 decreases and the emitter resistance $r_e$ becomes large and the voltage gain of the transistor TR1 is reduced, leading to decrease of the output voltage of the detector circuit 2.

In short, this automatic gain control circuit performs an automatic gain control by using a non-linear characteristic of the emitter resistor $r_e$ of the transistor TR1 with respect to variation of the base voltage of the same. When the input signal is small, i.e. $r_e < R3$, the non-linearity of the emitter resistor $r_e$ little influences the output signal and thus the distortion of the output signal is small. On the other hand, when the input signal voltage is large, i.e. $r_e > R3$, the non-linearity of the emitter resistance $r_e$ greatly influences the output signal, resulting in a large amount of distortion of the output signal.

SUMMARY OF THE INVENTION

Accordingly, an object of the present invention is to provide an automatic gain control circuit in which an output distortion is minimized even when an input signal is large.

Accordingly to one aspect of the present invention, there is provided an automatic gain control circuit comprising: a constant potential circuit point; an amplifier circuit of which an input terminal is connected to the constant potential circuit point through a resistor; a transistor of which the emitter-collector path is coupled in parallel with the resistor; and circuit means which is connected between the output terminal of the amplifier circuit and the base of the first transistor and supplies a base current corresponding to the output signal of the amplifier circuit to the base of the transistor.

Other objects and advantages of the present invention may be readily ascertained by referring to the following description and appended drawings, in which:

DETAILED DESCRIPTION OF THE PREFERRED EMBODIMENT

Figure 1:
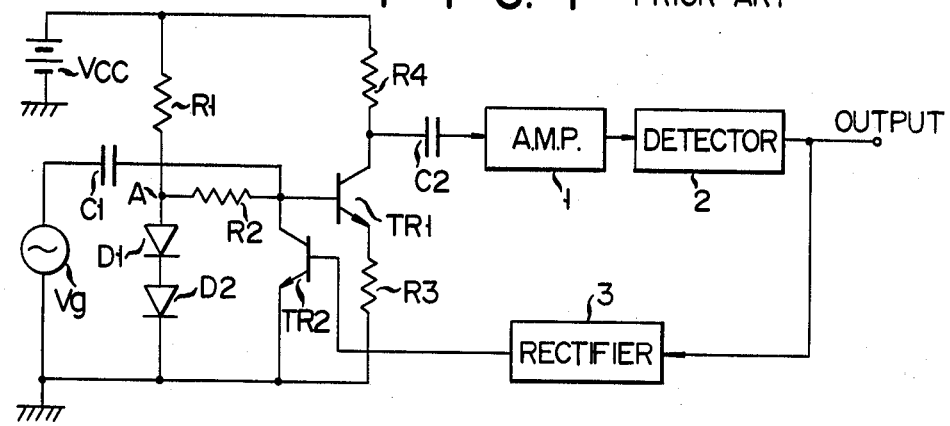
FIG. 1 shows a circuit diagram of a conventional automatic gain control circuit.

An automatic gain control circuit according to an embodiment of the present invention will be given with reference to FIGS. 2 and 3. In the figures, the same numerals are used to designate like or equivalent portions in FIG. 1.

Figure 2:
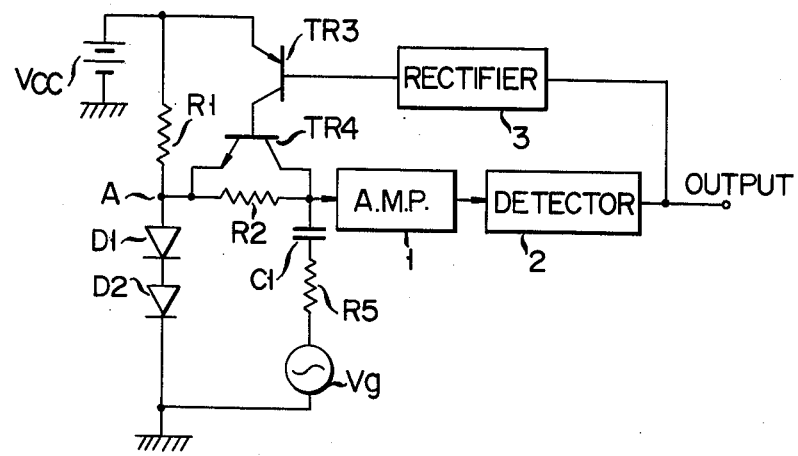
FIG. 2 shows a circuit diagram of an automatic gain control circuit according to an embodiment of the present invention.

In FIG. 2, a series circuit including a resistor R1 and a couple of diodes D1 and D2 is inserted between a DC power source $V_{cc}$ and ground. A junction A between the resistor R1 and the diode D1 provides a constant voltage to be applied to an amplifier circuit 1, by way of a resistor R2. A detector circuit 2 detects an output signal delivered from the amplifier circuit 1 and outputs the detected signal as an output signal of the automatic gain control circuit. The output signal of the detector 2 is also applied to a rectifier circuit 3 whose output terminal is coupled with the base of a PNP transistor TR3 having an emitter connected to the power source $V_{cc}$. The collector of the transistor TR3 is connected to the base of an NPN transistor TR4 which is connected at the emitter to the junction A and at the collector to the input terminal of the amplifier circuit 1. The output signal of an input signal source $V_g$ is applied to the amplifier circuit 1 via a resistor R5 and a capacitor C1.

In the automatic gain control circuit, when the output signal level of the amplifier 1 grows large, the base current of the transistor TR3 becomes large. Accordingly, the base current of the transistor TR4 becomes large. As a consequence, the impedance $Z_c$ in the collector-emitter path of the transistor TR4 becomes small.

An input voltage $V_{in}$ applied to the amplifier circuit 1 and derived from the input signal $V_g$ is given by the following equation $$V_{in} = \frac{\frac{R2 \cdot Z_c}{R2 + Z_c} + 2Z_D}{R5 + \frac{R2 \cdot Z_c}{R2 + Z_c} + 2Z_D} \times V_g$$

where $Z_D$ is an impedance of each of the diodes D1 and D2.

In the automatic gain control circuit, when the input signal has a small amplitude, $R5 < Z_c$ so that the signal $V_{in}$ is substantially equal to the signal $V_g$. On the other hand, when the input signal has a large amplitude, $R5 > Z_c$ so that the signal $V_{in}$ is smaller than the signal $V_g$ and hence the output signal of the detector 2 is restricted small in level. In this manner, gain is automatically controlled in this circuit. In this case, the impedance $Z_e$ in the collector-emitter path of the transistor TR4 depends on the collector current of the transistor TR3, i.e. the base current of the transistor TR4. Therefore, it varies more slowly than the input signal $V_g$. This minimizes distortion of the output signal of this circuit.

Figure 3:
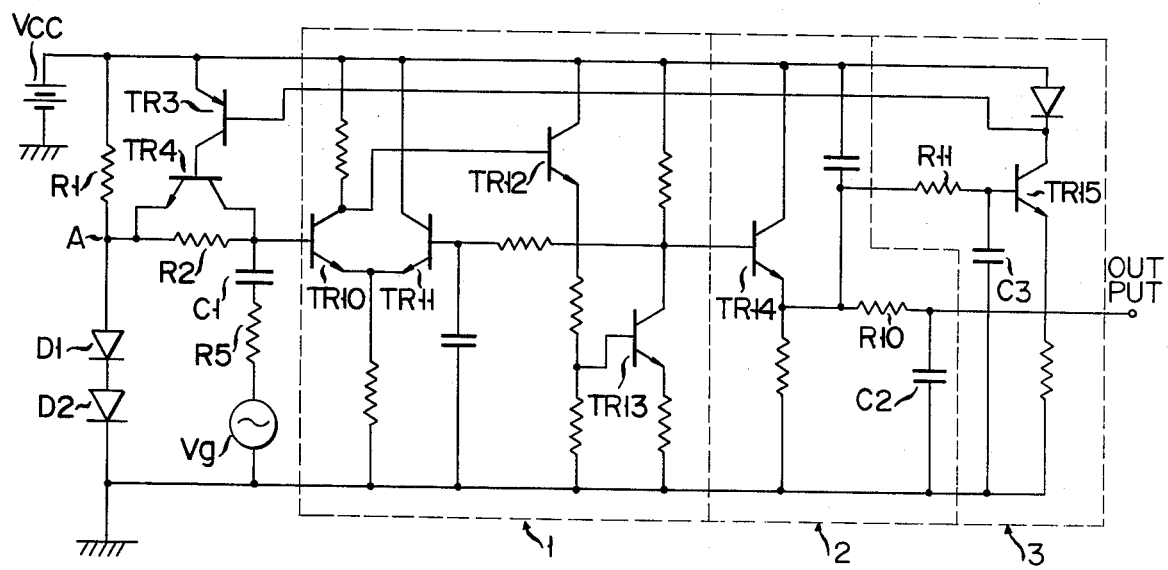
FIG. 3 shows the details of the automatic gain control circuit shown in FIG. 2.

The details of the circuit of FIG. 2 is illustrated in FIG. 3. In the figure, the amplifier circuit 1 includes four transistor TR10 to TR13 and constructed in the well known manner. The output signal of the amplifier circuit 1 is applied to the base of a transistor TR14 in the detector circuit 2. The high frequency component, i.e. the carrier frequency component, of the output signal of the transistor TR14 is by-passed through a capacitor C2 to ground. Only the audio signal component is taken from the output terminal, through a resistor R10. The output signal of the transistor TR14 is also applied to the base of a transistor TR15, through a time constant circuit including a resistor R11 and a capacitor C3. The time constant of the circuit is larger than that of the resistor R10 and the capacitor C2 combination. That is, the emitter voltage of the transistor TR14 is smoothed through the time constant circuit of the resistor R11 and the capacitor C3 so that a relatively slowly varying voltage is applied to the base of the transistor TR15. Thus, the base currents of the transistors TR3 and TR4 sluggishly changed so that the impedance $Z_c$ of the emitter-collector path of the transistor TR4 fails to follow an instantaneous change of the input signal $V_g$ to maintain its constancy.

It should be understood that the foregoing relates to only a preferred embodiment of the invention, and various modifications of the example of the invention herein can be made for the purposes of the disclosure without departing from the spirit and scope of the invention.

What is claimed is:

1. An automatic gain control circuit comprising:

a signal input terminal;

a constant potential circuit point;

an amplifier circuit having input and output terminals, the input terminal being connected to said constant potential circuit point through a first resistor and to said signal input terminal through a second resistor;

a first transistor having an emitter, collector, and base, the emitter-collector path being coupled in parallel with said first resistor; and circuit means connected to the output terminal of said amplifier circuit and to the base of said first transistor to supply a base current corresponding to the output signal of said amplifier circuit to the base of said first transistor.

2. An automatic gain control circuit according to claim 1 wherein said circuit means comprises:

a rectifier circuit connected to the output terminal of said amplifier circuit for rectifying the output signal of said amplifier circuit and smoothing the rectified signal, and a second transistor having an emitter, collector and base, the second transistor being connected at its base to the output of said rectifier circuit, at its emitter to the constant current terminal and at its collector to the base of said first transistor.

3. An automatic gain control circuit according to claim 2, further comprising a detector circuit which is connected between said amplifier circuit and said rectifier circuit to detect the output signal of said amplifier circuit and apply the detected output signal to said rectifier circuit.

* * * * *

UNITED STATES PATENT AND TRADEMARK OFFICE
CERTIFICATE OF CORRECTION

PATENT NO. : 4,155,048
DATED : May 15, 1979
INVENTOR(S) : YOZO KABAYAMA

It is certified that error appears in the above-identified patent and that said Letters Patent are hereby corrected as shown below:

First page, after inventor's name, assignee has been left off. Please add:

Assignee: Tokyo Shibaura Electric Co., Ltd.
Tokyo, Japan

Signed and Sealed this

First Day of January 1980

[SEAL]

Attest:

SIDNEY A. DIAMOND

Attesting Officer

Commissioner of Patents and Trademarks